United States Patent [19]

Ema et al.

[11] Patent Number: 5,214,304
[45] Date of Patent: May 25, 1993

[54] SEMICONDUCTOR DEVICE

[75] Inventors: Taiji Ema, Kawasaki; Kazunari Shirai, Yokohama, both of Japan

[73] Assignee: Fujitsu Limited, Kanagawa, Japan

[21] Appl. No.: 849,834

[22] Filed: Mar. 12, 1992

Related U.S. Application Data

[63] Continuation of Ser. No. 670,468, Mar. 13, 1991, abandoned, which is a continuation of Ser. No. 311,252, Feb. 16, 1989, abandoned.

[30] Foreign Application Priority Data

Feb. 17, 1988 [JP] Japan .................................. 63-34346

[51] Int. Cl.⁵ ...................... H01L 29/04; H01L 29/68
[52] U.S. Cl. .................................. 257/412; 257/306; 257/308; 257/655
[58] Field of Search ................. 357/59, 23.6, 90, 23.1, 357/51

[56] References Cited

U.S. PATENT DOCUMENTS

| 3,897,282 | 7/1975 | White ............................ 148/175 |
| 4,354,309 | 10/1982 | Gardiner et al. ............... 357/59 G |
| 4,903,096 | 2/1990 | Masuoka et al. ................ 357/59 |

FOREIGN PATENT DOCUMENTS

| 0012863 | 7/1980 | European Pat. Off. ........... 148/175 |
| 72.13782 | 4/1972 | France .......................... 148/175 |

Primary Examiner—Mark V. Prenty
Attorney, Agent, or Firm—Armstrong, Westerman, Hattori, McLeland & Naughton

[57] ABSTRACT

A semiconductor device comprises:
a insulating film having a first part and a second part, the second part being thiner than the first part; and
a polycrystalline silicon film having a first part arranged over the first part of the insulating film and a second part arranged over the second part of the insulating film, the second part of the polycrystalline silicon film having a lower concentration of impurities than that of the first part of the polycrystalline silicon film.

16 Claims, 7 Drawing Sheets

SEMICONDUCTOR DEVICE

This application is a continuation of application Ser. No. 670,468 filed Mar. 13, 1991 and now abandoned, which in turn is a continuation of application Ser. No. 311,252 filed Feb. 16, 1989 and now abandoned.

BACKGROUND OF THE INVENTION

1. Field of the Invention

The present invention relates to a semiconductor device, and more particularly, to a polycrystalline silicon electrode interconnection or wiring in contact with an insulating film at a portion thereof having a thinner thickness than at other portions and provided in semiconductor devices such as an MIS (Metal Insulator Semiconductor) LSI, and a DRAM (Dynamic Random Access Memory).

2. Description of the Related Art

The miniaturization of semiconductor elements such as a MIS transistors in an LSI, for example, a memory device such as a DRAM, has led to a gradual thinning of the gate insulating film and capacitor dielectric film of silicon dioxide ($SiO_2$) therein.

During experiments by the present inventors, it was found that, when the thickness of the gate insulating film of a MIS transistor becomes less then 100 Å, for example about 50 Å, a remarkable deviation and deterioration of the quality, such as a deviation of the threshold value, and deterioration of the gate breakdown valtage, etc., occurs. Further it was found recognized that, in a DRAM having a stacked type memory cell, when the thickness of a dielectric film forming a memory cell capacitor becomes thin, a short-circuit between the capacitor electrodes is apt to occur.

SUMMARY OF THE INVENTION

Accordingly, an object of the present invention is to prevent a deterioration of the quality of an element and an increase of the defect rate caused by miniaturization of the semiconductor elements. In particular, the object of the present invention is to prevent the deviation of quality, such as the deviation of the threshold value and deterioration of the gate breakdown voltage of the MIS transistor due to a thinning of the gate insulating film.

A further object of the present invention is to decrease the defect generation rate of the memory capacitor caused by the thinning of the capacitor caused by the thinning of the capacitor dialectic film of the DRAM cell.

Therefore, according to the present invention, there is provided a semiconductor device comprising:

an insulating film having a first part and a second part, the second part being thinner than the first part; and a polycrystalline silicon (poly Si) film having a first part arranged over the first part of said insulating film and a second part arranged over the second part of said insulating film, the second part of said polycrystalline silicon film having a lower concentration of impurities than that of the first part of said polycrystalline silicon film.

DESCRIPTION OF THE PREFERRED EMBODIMENTS

The preferred embodiments of the invention will now be explained.

The present inventors found, by experiment, that the aforementioned problems occur most when a gate electrode or a capacitor plate electrode is made of polycrystalline silicon, and that the thickness of an insulating film arranged below the poly Si film and the impurity concentration in the poly si film have a remarkable influence on the defect generation ratio.

Figure 1:
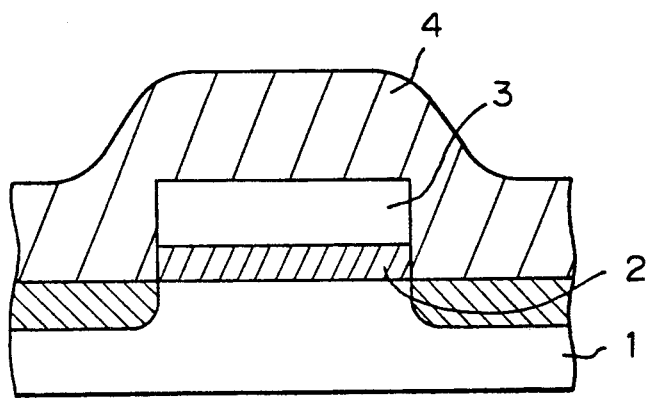
FIG. 1 is a cross-sectional view of a MIS transistor.

Due to this miniaturization of semiconductor elements, the lengths of interconnections or wiring are increased and the width thereof reduced, and thus although the interconnection resistance is enhanced, problems of delays in operation arise. Accordingly, when polycrystalline silicon is widely used as the material for, for example, a gate electrodes as shown in FIG. 1, the interconnection resistance is lowered by an increased amount of impurities introduced into the poly Si gate electrode 3.

The increase of the impurity concentration in the poly Si, which is used for lowering the electric resistance, becomes the cause of a generation of defects in the MIS transistor or DRAM cell.

The relationship between the gate insulating film thickness and the impurity concentration in the MIS transistor will be explained with reference to FIGS. 1 and 2.

When the thickness of the gate insulating film 2, e.g., $SiO_2$, becomes less than 100 Å, for example, about 50 Å, a deviation of the threshold value and a deterioration of gate breakdown voltage are generated by a diffusion of impurities from an impurity introduced by a poly Si gate electrode 3 which is in contact with the gate insulating film 2 arranged on an Si substrate 1. In FIG. 1 4 denotes an insulating film such as PSG or $SiO_2$.

Figure 2:
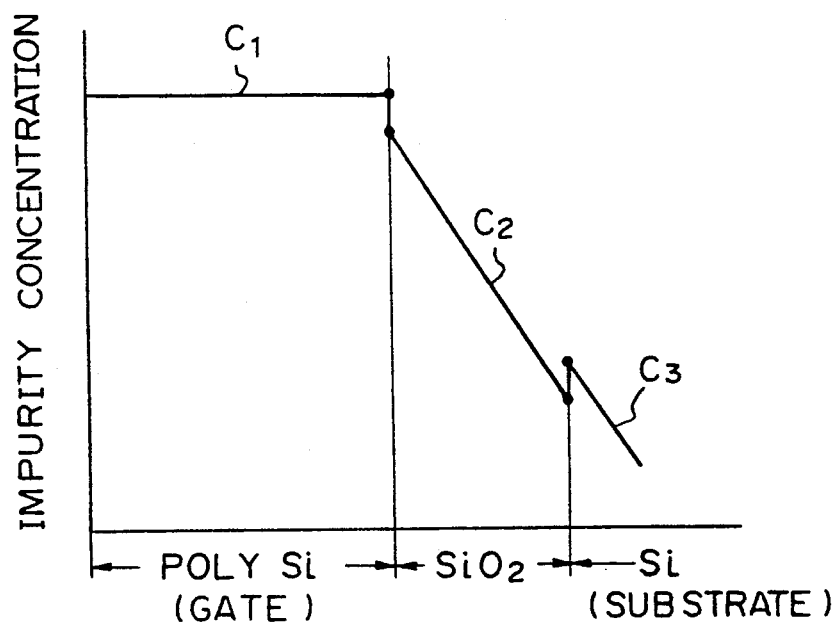
FIG. 2 is a graph of an impurity concentration in a poly Si gate, a $SiO_2$ gate insulating film, and a Si substrate.

As shown in FIG. 2 illustrating an impurity concentration profile or distribution, impurities introduced into the electrode interconnection as shown in line C, are self-diffused to some extent into the gate $SiO_2$ film as shown in line $C_2$ and into the silicon substrate through the $SiO_2$ film as shown in line $C_3$. The ordinate axis is shown in logarithmic scale.

The diffusion of the impurities into the gate $SiO_2$, etc., is effected by a heat treatment carried out after the formation of the gate electrode. As can be seen from FIG. 2 the insulating properties of the $SiO_2$ film are deteriorated as shown in the impurity diffusion line $C_2$, particularly near the Poly Si gate electrode. Further, the threshold voltage is varied by the impurity diffusion shown in line $C_3$, and the diffusion region of the $SiO_2$ film, etc., is varied, depending on the temperature, time and atmosphere of the heat treatment.

For example, it was found that, when the diffusion depth in the gate insulating film was about 20 Å, which depth is 10% or less that of a conventionally used gate $SiO_2$ film thickness of about 200 to 300 Å, the diffusion did not have a great influence on the quality, but as the miniaturization of is advanced, the above-mentioned diffusion depth has a high ratio, e.g., about 40% of the gate $SiO_2$ film thickness and the diffusion has a serious influence on the transistor quality, such as deviation of the threshold value and deterioration of the gate breakdown voltage etc.

FIG. 2 shows a graph of an impurity concentration in a poly Si gate ($C_1$), a $SiO_2$ gate insulating film ($C_2$), and a Si substrate ($C_3$), wherein the transverse axis shows the depth, and $C_1$, $C_2$, and $C_3$ are the impurity concentration distribution.

Figure 3:
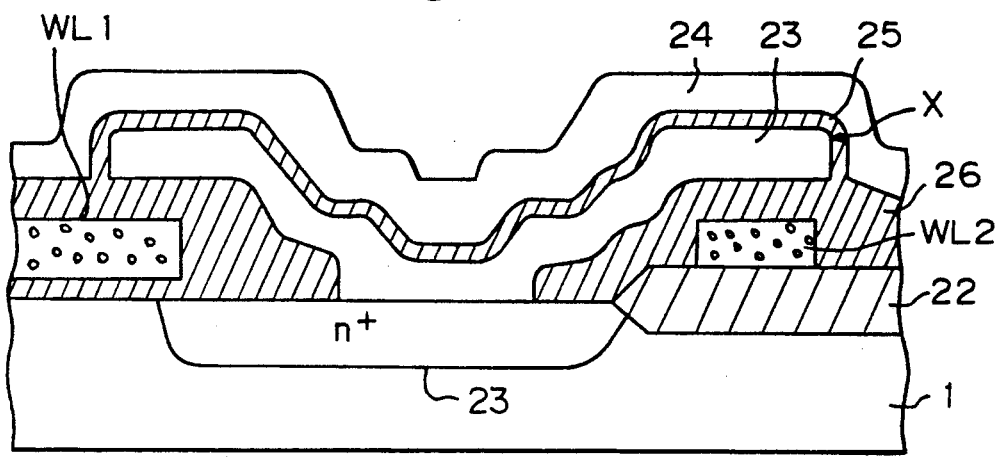
FIG. 3 shows a cross-sectional view of a stacked type DRAM cell.
Figure 4A:
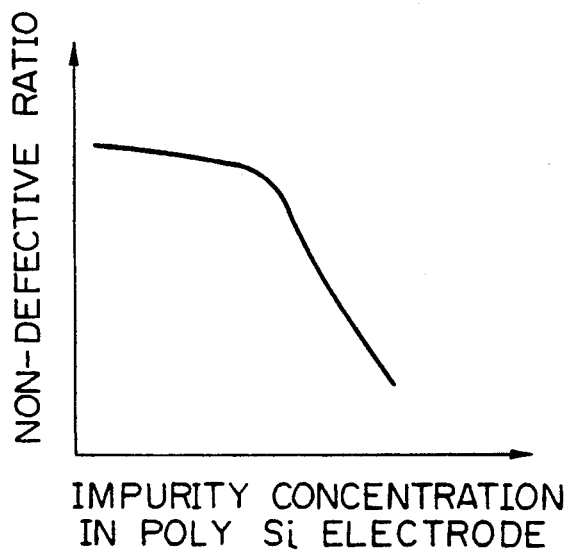
FIG. 4A is a graph of the relationship between the non-defective ratio and the impurity concentration in a poly Si electrode.

Further, in a DRAM cell shown in FIG. 3, when an insulating film such as $SiO_2$ 25 between a Poly Si charge storage electrode 23 and the other poly Si capacitor plate electrode 24 is thinned, impurities introduced into both poly Si electrodes, particularly the electrode 24, are diffused into the insulating film 23. In FIG. 3, 1, 22 and 26 denoted a p-Si substrate, a field $SiO_2$ film, and an insulating film, respectively. Therefore, when the impurity concentration of the poly Si electrodes becomes higher than a desired level, the non-defective ratio becomes lower, as shown in FIG. 4A.

On the other hand, from the viewpoint of the capacitance loss derived from the formation of a depletion layer, a higher impurity concentration reduces this capacitance loss.

Figure 4B:
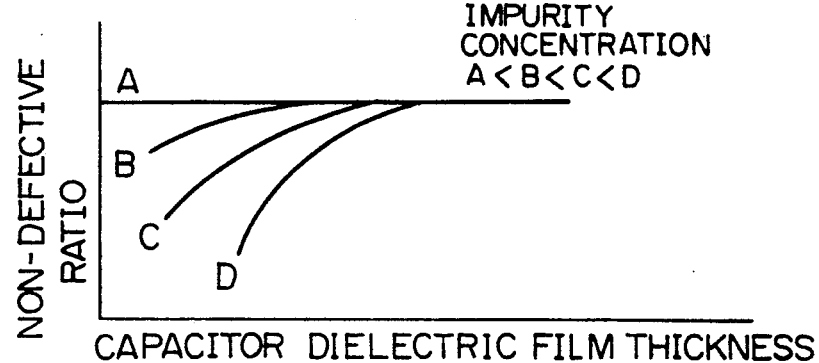
FIG. 4B is a graph of the relationship between non-defective ratio and capacitor dielectric film thickness when impurity concentration was changed.

FIG. 4B is a graph of the relationship between non-defective ratio and capacitor dielectric film thickness when impurity concentration was changed.

As shown in FIG. 4B as the impurity concentration is increased the non-defective ratio is reduced.

Figure 5:
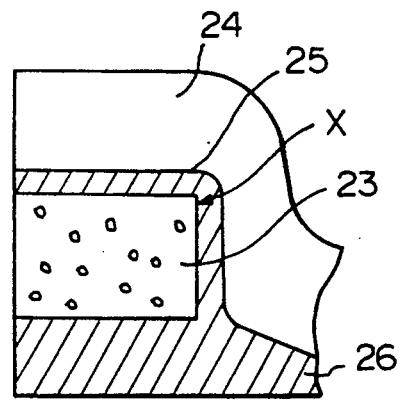
FIG. 5 is a partial cross sectional view of FIG. 3 explaining step X.

The insulating film between the charge storage electrode and the capacitor plate electrode is broken down at the step X as shown in FIG. 3 by the stress concentration threat, as shown particularly in FIG. 5. The stress concentration at the step X becomes larger as the edge form of the charge storage electrode 23 becomes sharper. But, round off the edge of the charge storage electrode is difficult. When a concentration of impurities introduced into the capacitor plate electrode becomes large, grains in the electrode become large, and thus mechanical and local stresses therein are enhanced, particularly near the edge of the charge storage electrode. In this DRAM, when the thickness of a capacitance forming insulating film is larger than about 130 Å the non-defective ratio is substantially 100%, but when the thickness thereof is less than about 60 Å, the non-defective ratio is lowered as the introduced impurity concentration is increased, particularly to more than $10^{21}/cm^3$.

The present invention is derived from the above-explained findings of the inventors.

Figure 6A:
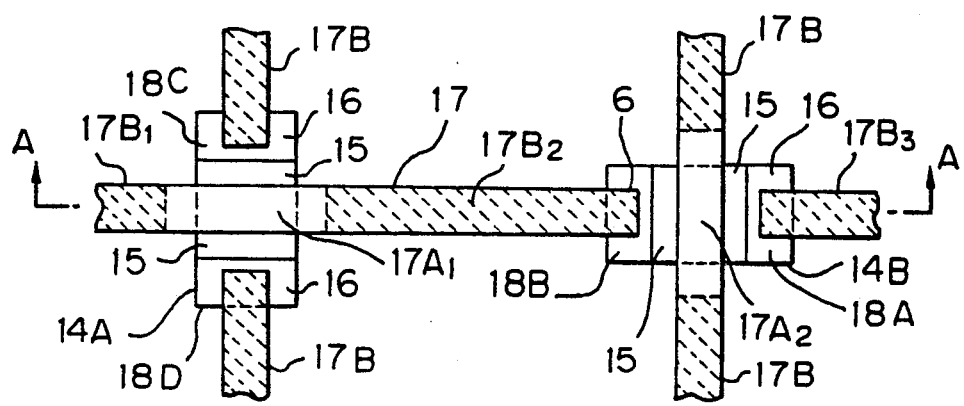
FIG. 6A is a plan view of a first embodiment of a MIS semiconductor device according to the present invention.
Figure 6B:
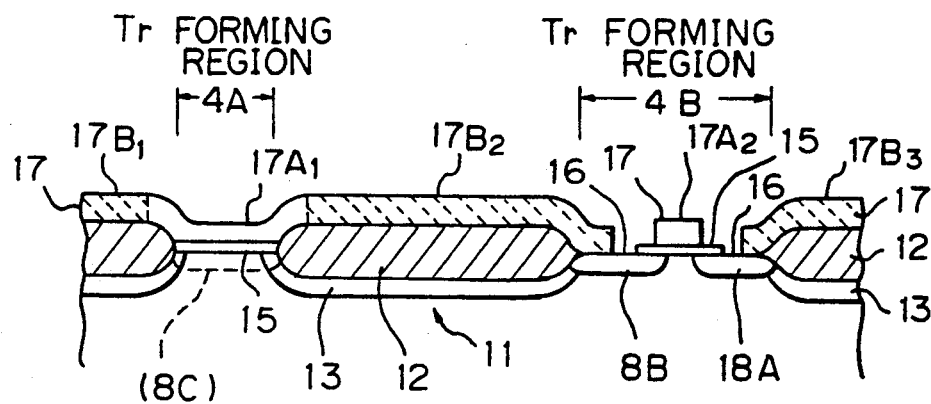
FIG. 6B is a cross-sectional view taken along the line A—A of FIG. 6A.

FIG. 6A is a plan view of a first embodiment of a MIS semiconductor device according to the present invention, and FIG. 6B is a cross-sectional view taken along the line A—A of FIG. 6A.

As shown in FIGS. 6A and 6B the MIS semiconductor device has a first transistor forming region 14A and a second transistor forming region 14B, with a gate insulating film having a thin thickness of about 50 Å, and a polycrystalline silicon (Poly Si) pattern having n⁻ gate electrode portions 17A₁ and 17A₂ having a high sheet resistance of, for example, about 600 Ω/□ obtained by introducing a low concentration of impurities, e.g., phosphorus or arsenic, of about $10^{18}$ to $10^{20}$ cm⁻³ thereto, and n⁺ interconnection portions 17B, 17B₁, 17B₂, and 17B₃ having a low sheet resistance of, for example, about 25 Ω/□, obtained by introducing a high concentration impurities, e.g., phosphorus or arsenic, of about $10^{20}$ to $10^{22}$ cm⁻³ thereto.

The interconnections 17, i.e., 17A₁, 17A₂, 17B, 17B₁, 17B₂ and 17B₃, are provided on a p⁻ Si substrate 11 and a field $SiO_2$ film 12 having a thick thickness, particularly as shown in FIG. 6B.

In FIGS. 6A and 6B, a p-channel stopper region 13, gate $SiO_2$ films 15, contact windows 16, and n⁺ source/drain regions 18A to 18D are also provided.

Namely, in the MIS semiconductor device shown in FIGS. 6A and 6B, the impurities introduced into the gate electrode portions 17A₁ and 17A₂ are limited to a low concentration level, and thus the diffusion of the impurities into a thin gate $SiO_2$ film 15 is also limited.

The MIS semiconductor device shown in FIGS. 6A and 6B can be produced by the following steps, as shown in FIGS. 7A to 7D.

Figure 7A:
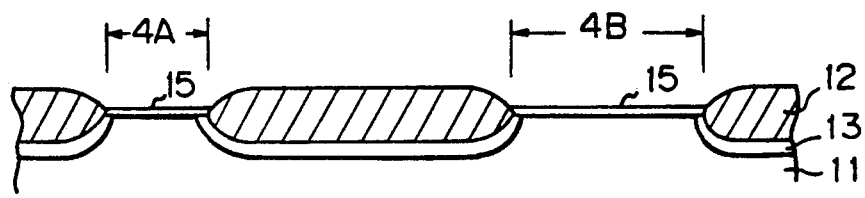
FIGS. 7A to 7D are cross-sectional views of the process of producing the structure shown in FIGS. 6A and 6B.

As shown in FIG. 7A, field $SiO_2$ films 12 having P channel stopper regions 13 therebelow are formed on a p⁻ Si substrate 11 by a usual method, so that first and second transistor forming regions are exposed, and then gate $SiO_2$ films 15 having a thickness of about 50 Å are formed on the first and second transistor forming regions 14A and 14B by a well known thermal oxidation process.

Figure 7B:
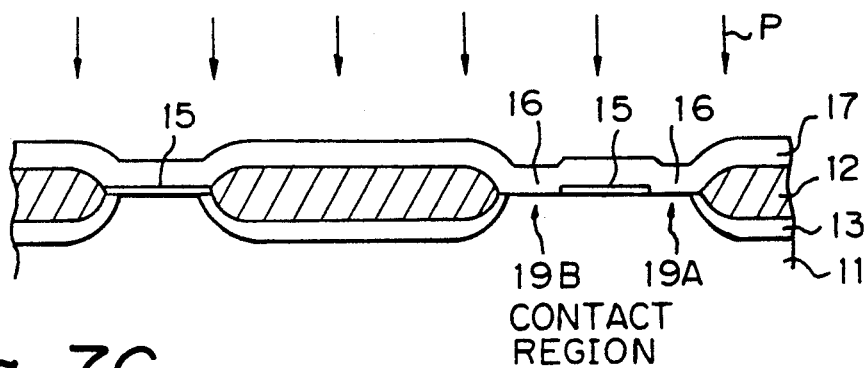

Then, as shown in FIG. 7B, a gate $SiO_2$ film 15 arranged on regions 19A and 19B, where a source/drain contact is effected, are selectively removed by a usual photolithography technique so that contact windows 16 are formed. Then a poly Si layer 17 having a thickness of about 4000 Å is formed on the substrate 11 by a CVD process and, for example, phosphorus (P) is introduced into the entire surface of the Poly Si layer 17, at a low concentration, by a usual gas diffusion process, whereby the phosphorus concentration of the Poly Si layer 17 is controlled to to $10^{18}$ to $10^{20}$ cm⁻³ and the sheet resistance is made an n⁻ type of about 600 Ω/□.

Figure 7C:
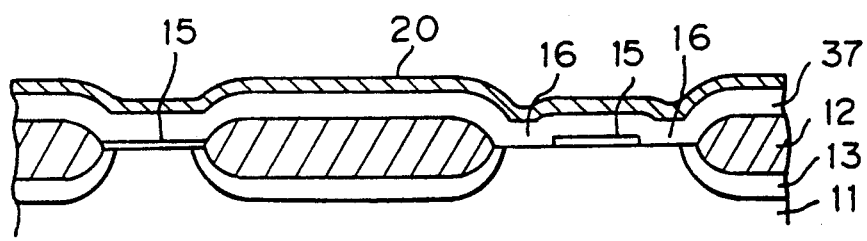

Then, as shown in FIG. 7C, a $SiO_2$ film 20 having a thickness of about 500 Å is formed on the poly Si layer 17 by the thermal oxidation and the poly Si layer 17 is patterned by a usual photolithography technique, so that an n⁻ poly Si pattern 37 is formed.

Figure 7D:
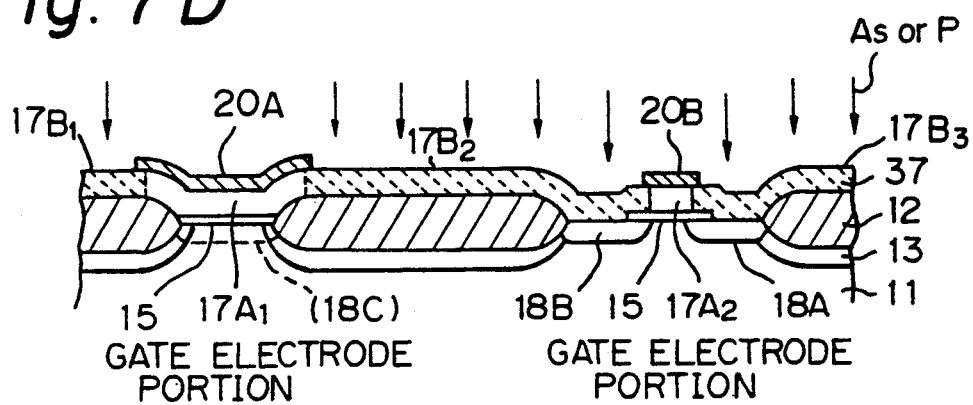

Then, as shown in FIG. 7D, the $SiO_2$ film 20 is patterned by a usual photolithography technique using the $SiO_2$ film 20 as a mask, and thus $SiO_2$ mask patterns 20A and 20B covering gate electrode portions 17A₁, 17A₂, etc., are formed on the n⁻ poly Si pattern 37. Then, using the SiO$_2$ mask patterns 20A and 20B, a high concentration of phosphorus or arsenic, e.g., $10^{19}$ to $10^{21}/cm^3$, is selectively introduced into the exposed regions by a usual gas diffusion process, so that n+ interconnection or wiring forming portions 17B$_1$, 17B$_2$ and 17B$_3$ and n+source/drain regions 18A, 18B and 18C having a low sheet resistance of about 25 Ω/□ are formed. In this process, the n+ region, which is monolithic to the source/drain regions 18A, 18B, 18C, etc., can be formed on the surface of the substrate 11 positioned below the interconnection forming portions 17B$_1$, 17B$_2$, and 17B$_3$.

Then, as shown in FIG. 6B, the poly Si pattern 37 is separated to form a required shape by a usual photolithography technique, so that a MIS semiconductor device providing poly Si electrode interconnection or wiring 17 having low impurity concentration n⁻ gate electrode portions 17A$_1$ and 17A$_2$ with a high sheet resistance and a high impurity concentration n+ interconnection or wiring portions 17B, 17B$_1$, 17B$_2$, 17B$_3$ with a low sheet resistance are produced.

Figure 8A:
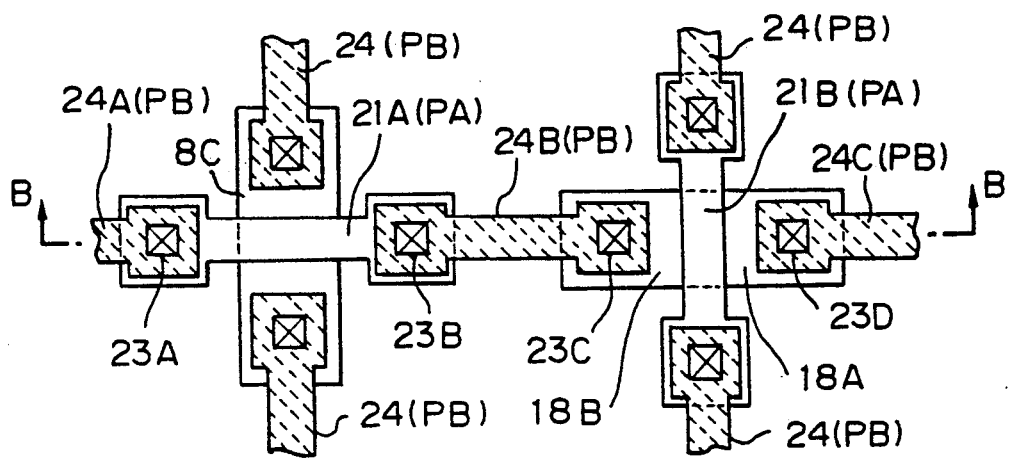
FIG. 8A is a plan view of a second embodiment of MIS semiconductor device according to the present invention.
Figure 8B:
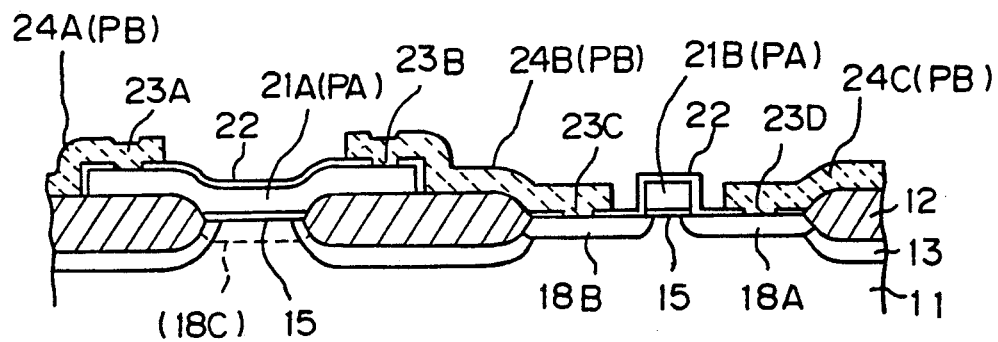
FIG. 8B is a cross sectional view taken along the line B—B of FIG. 8A.

FIG. 8A is a plan view of a second embodiment of a MIS semiconductor device having a poly Si electrode interconnection consisting of two poly Si layers according to the present invention, and FIG. 8B is a cross-sectional view taken along the line B—B of FIG. 8A. As shown in FIGS. 8A and 8B, n⁻ poly Si gate electrodes 21A and 21B corresponding to the gate electrode portions 17A$_1$ and 17A$_2$ of the first embodiment are formed by a first poly Si layer (PA) (lower layer), and n+poly Si interconnection portions 24, 24A, 24B, and 24C corresponding to interconnection portions 17B, 17B$_1$, 17B$_2$ and 17B$_3$ are formed by a second poly Si layer (PB) (upper layer). The n⁻ poly Si gate electrode 21A is connected to the n+poly Si interconnections 24 and 24B through contact windows formed in an insulating film, for example, a SiO$_2$ film 2. Further, the other end portion of the poly Si interconnection 24B is connected to an n+ source/drain region 18A of a MOS transistor formed in the region 4B through a contact window 22 formed on the upper surface of the source/drain region.

Figure 9A:
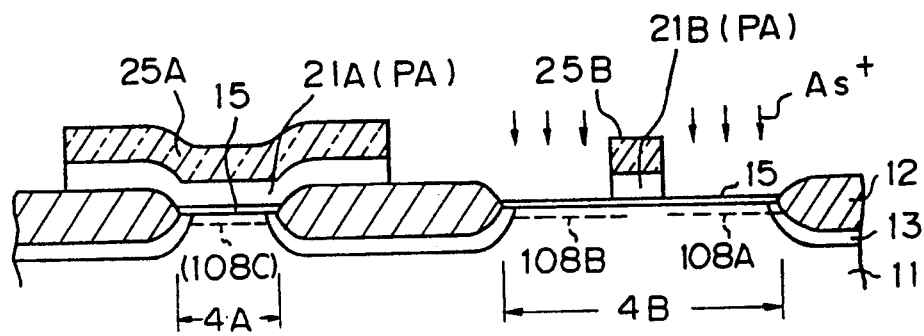
FIGS. 9A to 9C are cross sectional views of the process for producing the structure shown in FIGS. 8A and 8B; and, FIG. 10 is a cross-sectional view of a third embodiment of a stacked type DRAM cell according to the present invention.
Figure 9B:
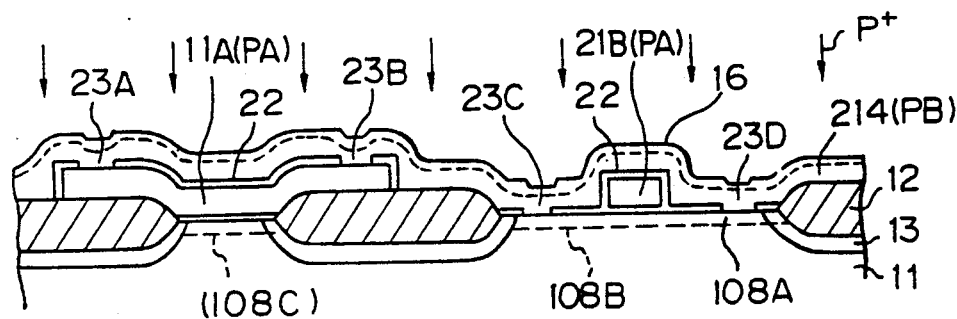
Figure 9C:
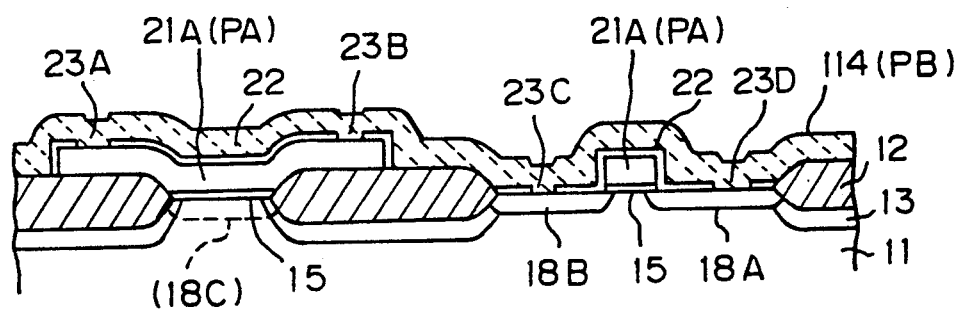

The structure shown in FIGS. 8A and 8B can be produced by the process shown in FIGS. 9A to 9C.

As shown in FIG. 9A, a gate SiO$_2$ film 15 having a thickness of about 50 Å is formed by a thermal oxidation process in the first and second transistor forming regions 14A and 14B defined by a field SiO$_2$ film 12 and p channel stopper region 13. Then, a first poly Si layer (PA) is formed on a p⁻ Si substrate, a low concentration of phosphorus, which is the same as in the first embodiment, is introduced into the first poly Si layer, n-poly Si gate electrodes 21A and 21B by patterning the poly Si layer using resist patterns 25A and 25B as a mask, and subsequently, a high concentration of arsenic ions (As+) is implanted into the transistor forming regions 14A and 14B through the gate SiO$_2$ film 15 using the resist patterns 25A and 25B as a mask, whereby high concentration As+implanted regions 108A, 108B and (108C), which become source/drain regions, are formed.

Then, as shown in FIG. 9B, after removing the resist patterns 25A and 25B and exposed gate SiO$_2$ film 15, a SiO$_2$ film 22 having a thickness of about 1000 Å is formed on the surface of the gate electrodes 21A and 21B and exposed substrate surface in the transistor forming regions 14A and 14B by a thermal oxidation process, etc., and subsequently, contact windows 23A, 23B, 23C and 23D are formed in the SiO$_2$ film 22. Then, a second poly Si (PB) layer 214 having a thickness of about 5000 Å is formed on the substrate 11.

A high concentration of phosphorus ions (p+) is implanted into the second poly Si (PB) layer so that the high concentration p+ implanted region 26 is formed.

Then, as shown in FIG. 9C, by carrying out a heat treatment process p+ implanted at a high concentration is activated and redistributed so that a second n+ poly Si layer (PB) 114 having low sheet resistance is formed, and at the same time, the high concentration As+ is activated and redistributed so that n+ source/drain regions 8A, 8B, and (8C) are formed.

Then, as shown in FIGS. 8A and 8B, the second n+ poly Si layer (PB) 114 is patterned by a usual photolithography technique and an n+ poly Si interconnection 24A, which is connected to an end portion of the gate electrode 21A, an n+ poly Si interconnection 24B, which is in contact with the other end portion of the gate electrode 21A, and the source/drain region 18B through though the contact windows 23B and 23C, and the n+ poly Si interconnection layer 24C, which is connected to the source/drain region region 18A through the contact window 23D, are formed, respectively, whereby the second embodiment of the MIS semiconductor device is realized.

The third embodiment in which the present invention was applied of to a stacked type DRAM cell will be explained with reference to FIG. 10.

Figure 10:
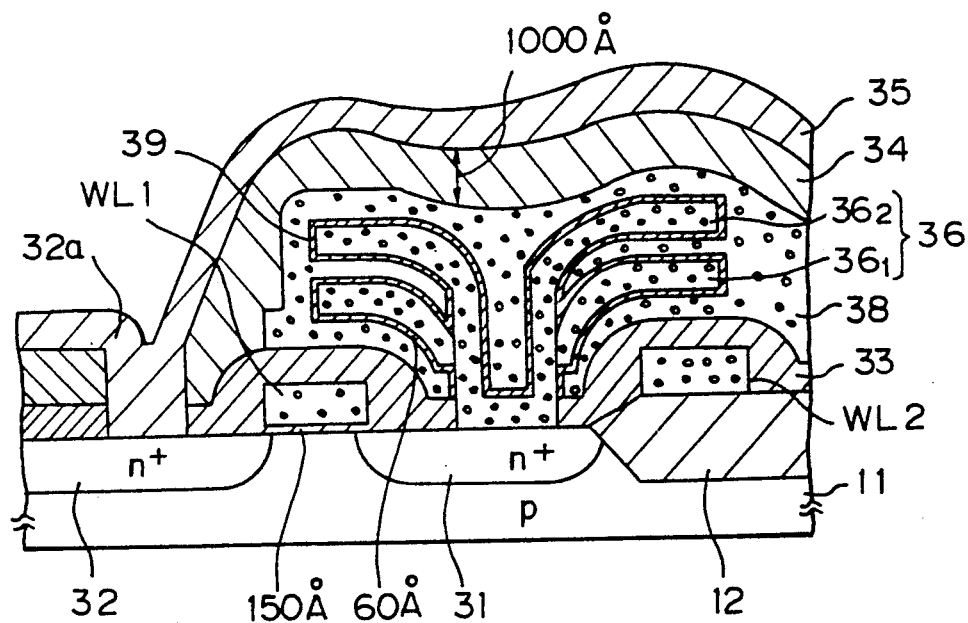

FIG. 10 is a cross-sectional view of a DRAM cell according to the present invention.

When the impurity concentration of the poly Si capacitor plate electrode 25 in the DRAM cell shown in FIG. 3 the defect ratio can be remarkably lowered. Particularly, in the DRAM cell shown in FIG. 10, the area of the charge storage electrode 36 and the capacitor plate electrode 38 having the dielectric film 39 therebetween is large, and thus the effect of the present invention is remarkable.

In FIG. 10 a field SiO$_2$ film 12, As+ implanted diffusion layers (source/drain) 32 and 31, and gate electrodes (WL1) and (WL2) of poly Si are provided on a p-Si substrate 11. The extension of the WL1 and WL2 are word lines in the DRAM, and a bit line (not shown) is connected to the source 32. The layer insulating the gate electrodes WL1 and WL2 is an insulating film 33 such as a Si$_3$N$_4$ film. Thus a transfer transistor is formed. Reference 36 (36$_1$, 36$_2$) denotes a poly Si charge storage electrode, and 38 denotes the Poly Si capacitor plate electrode.

The poly Si charge storage electrode and the poly Si capacitor plate electrode and the dielectric film 39 therebetween, form a charge storage capacitor.

In a gate electrode WL1, impurities for example, phosphorus having a concentration of to $10^{20}$ to $10^{21}/cm^3$ are introduced thereto. The thickness of the insulating layer below the gate electrode WL1 is about 150 Å. On the other hand, in the poly Si electrode 36, impurities, for example, phosphorus, having a concentration of $10^{19}$ to $10^{20}/cm^3$ are introduced thereto. The thickness of the dielectric film 39 is about 60 Å, and a PSG layer 34 L covering the electrode 36 has a thickness of 1000 Å. References 32a and 35 denote drawing electrodes and wiring. The concentration of impurities (arsenic) of the bit line is about $10^{21}/cm^3$. The thickness of the SiO$_2$ film with which the bit line is in contact is about 1000 Å. According to the present invention preferably the impurity concentration in poly Si stacked on a insulating film having a minimum thickness is lower than the impurity concentration in other portions.

As explained above, according to the present invention, the (gate) insulating film can be formed so that it has very thin thickness, since impurities introduced into the electrode interconnection or wiring are controlled to a low level.

While the invention has been particularly shown and described in reference to preferred embodiments thereof, it will be understood by those skilled in the art that changes in form and details may be made therein without departing from the spirit and scope of the invention.

We claim:

1. A semiconductor device comprising:
   first and second insulating films, the second insulating film being thinner than the first insulating film; and
   a polycrystalline silicone film having a first part arranged on the first insulating film and a second part arranged on the second insulating film, the second part of said polycrystalline silicon film having a substantially uniform concentration of impurities, the second part of said polycrystalline silicon film having a lower concentration of impurities than that of the first part of said polycrystalline silicon film.

2. A semiconductor device according to claim 1, wherein said device comprises a MIS transistor having a gate electrode composed of the second part of said polycrystalline silicon film, a gate insulator composed of the second insulating film, a field insulator composed of the first insulating film, and a wiring composed of the first part of said polycrystalline silicon film and connected to the gate electrode.

3. A semiconductor device according to claim 2, wherein said first and second parts of said polycrystalline silicon film are arranged in a single layer.

4. A semiconductor device according to claim 2, wherein the first and second insulating films are arranged in different layers.

5. A semiconductor device according to claim 1, wherein the concentration of impurities in the second part of said polycrystalline silicon film is $10^{18}/cm^3$ to $10^{20}/cm^3$, and the concentration of impurities in the first part of the polycrystalline silicon film if $10^{19}/cm^3$ to $10^{21}/cm^3$.

6. A semiconductor device according to claim 1, wherein a thickness of the second insulating film is less than 100 Å.

7. A semiconductor device according to claim 6, wherein a thickness of the first insulating film is more than 1000 Å.

8. A semiconductor device according to claim 5, wherein a thickness of the second insulating film is less than 100 Å.

9. A semiconductor device according to claim 8, wherein a thickness of the first insulating film is more than 1000 Å.

10. A semiconductor device according to claim 1, wherein the thickness of the second insulating film is less than 100 Å.

11. A semiconductor device comprising:
    first and second insulating films, the second insulating film being thinner than the first insulating film; and
    a polycrystalline silicon film having a first part arranged on the first insulating film and a second part arranged on the second insulating film, the second part of said polycrystalline silicon film having a concentration of impurities, the second part of said polycrystalline silicon film having a lower concentration of impurities than that of the first part of said polycrystalline silicon film, and the first and the second parts of said polycrystalline silicon film being formed as a continuous layer.

12. Dynamic type semiconductor memory device comprising:
    a word line;
    a bit line; and
    a dynamic type memory cell, connected to said word line and said bit line, including a stacked type capacitor comprising a storage electrode, a dielectric film formed on the storage electrode, and a capacitor plate electrode formed on the dielectric film, the capacitor plate electrode being comprised of a first polycrystalline film having a lower concentration of impurities than that of a second polycrystalline film.

13. A dynamic type semiconductor memory device according to claim 12, wherein one of the word line, the bit line, the storage electrode is comprised of a second part of the polycrystalline silicon film.

14. A dynamic type semiconductor memory device according to claim 12, wherein the thickness of the dielectric film is less than 100 Å.

15. A dynamic type semiconductor memory device according to claim 12, wherein the concentration of impurities in a first part of said polycrystalline silicon film is $10^{18}/cm^3$ to $10^{20}/cm^3$, and the concentration of impurities in a second part of the polycrystalline silicon film is $10^{20}/cm^3$ to $10^{21}/cm^3$.

16. A semiconductor device comprising:
    first and second insulating films, the second insulating film being thinner than the first insulating film;
    a first polycrystalline silicon film arranged over the first insulating film and a second polycrystalline silicon film arranged over the second insulating film, the second polycrystalline silicon film having a concentration of impurities, the second polycrystalline silicon film having a lower concentration of impurities than that of the first polycrystalline silicon film; and
    a dynamic type memory cell including a cell capacitor composed of a charge storage electrode arranged underneath the second insulating film, a capacitor dielectric film composed of the second insulating film, and a capacitor plate electrode composed of the second polycrystalline silicon film.

* * * * *